United States Patent

Uehara

(10) Patent No.: US 9,210,765 B2
(45) Date of Patent: Dec. 8, 2015

(54) ELECTRONIC DEVICE AND ELECTRONIC EQUIPMENT PROVIDED WITH THE ELECTRONIC DEVICE

(75) Inventor: Masamitsu Uehara, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 1489 days.

(21) Appl. No.: 11/988,866

(22) PCT Filed: Jul. 19, 2006

(86) PCT No.: PCT/JP2006/314270
§ 371 (c)(1),
(2), (4) Date: Feb. 21, 2008

(87) PCT Pub. No.: WO2007/010938
PCT Pub. Date: Jan. 25, 2007

(65) Prior Publication Data
US 2009/0026925 A1    Jan. 29, 2009

(30) Foreign Application Priority Data

Jul. 20, 2005  (JP) ................. 2005-209549

(51) Int. Cl.
| | |
|---|---|
| *H01J 1/62* | (2006.01) |
| *H01J 9/00* | (2006.01) |
| *H05B 33/14* | (2006.01) |
| *C09K 11/06* | (2006.01) |
| *H01L 51/00* | (2006.01) |
| *H01L 51/50* | (2006.01) |

(52) U.S. Cl.
CPC .............. *H05B 33/14* (2013.01); *C09K 11/06* (2013.01); *H01L 51/006* (2013.01);
(Continued)

(58) Field of Classification Search
USPC ........................................... 428/690
See application file for complete search history.

(56) References Cited

U.S. PATENT DOCUMENTS

| 6,396,209 B1* | 5/2002 | Kido et al. ................. 313/504 |
| 7,625,596 B2* | 12/2009 | Lewis et al. ................. 427/66 |
| 2003/0087126 A1* | 5/2003 | Ishida et al. ................ 428/690 |
| 2003/0222559 A1 | 12/2003 | Cok | |
| 2004/0222738 A1 | 11/2004 | Liao et al. | |

(Continued)

FOREIGN PATENT DOCUMENTS

| JP | A 09-255774 | 9/1997 |
| JP | A 2004-055535 | 2/2004 |
| JP | A 2004-335475 | 11/2004 |

*Primary Examiner* — J. L. Yang
(74) *Attorney, Agent, or Firm* — Oliff PLC

(57) ABSTRACT

An electronic device having an intermediate layer which can transfer smoothly carriers between two layers adjacent to the intermediate layer and having improved properties, and electronic equipment having high reliability are provided. An electronic device includes a pair of electrodes and laminated layers provided between the electrodes. The laminated layers include a hole transport layer (first organic semiconductor layer), a light emitting layer (second organic semiconductor layer), and an intermediate layer provided between the first and second organic semiconductor layers so as to make contact with both of the hole transport layer and the light emitting layer. The intermediate layer is constituted of a compound represented by a general formula $A^1$-B-$A^2$. In this formula, each of the $A^1$ and $A^2$ is a group including at least one of a primary amino group, a secondary amino group, a tertiary amino group, a hydroxyl group, a carbonyl group and a carboxyl group, the $A^1$ and $A^2$ are the same or different, and optionally simultaneously exist, and the B is a group including a fluorene ring. Molecules of the compound are oriented in a state that each group $A^1$ and each group $A^2$ are positioned on the side of the hole transport layer and each group B is positioned on the side of the light emitting layer.

15 Claims, 5 Drawing Sheets

(52) U.S. Cl.
CPC ....... *H01L 51/0039* (2013.01); *H01L 51/0058* (2013.01); *H01L 51/0072* (2013.01); *C09K 2211/1007* (2013.01); *C09K 2211/1011* (2013.01); *C09K 2211/1014* (2013.01); *C09K 2211/1029* (2013.01); *H01L 51/5048* (2013.01); *Y02E 10/549* (2013.01)

(56) References Cited

U.S. PATENT DOCUMENTS

2005/0123795 A1* 6/2005 Lussier et al. ................ 428/690
2005/0236977 A1* 10/2005 Yamada et al. ............... 313/504

* cited by examiner

ELECTRONIC DEVICE AND ELECTRONIC EQUIPMENT PROVIDED WITH THE ELECTRONIC DEVICE

BACKGROUND

1. Technical Field

The present invention relates to an electronic device and electronic equipment provided with the electronic device.

2. Related Art

There is known an electronic device having laminated layers in which a plurality of organic semiconductor layers are laminated. Examples of such an electronic device include an organic electroluminescence device (hereinafter, simply referred to as an "organic EL device") and a photoelectric conversion device such as a solar cell.

Among them, the organic EL device have been extensively developed in expectation of their use as solid-state luminescent devices or emitting devices for use in inexpensive large full-color displays.

In general, such an organic EL device has a structure in which a light emitting layer is provided between a cathode and an anode. When an electric field is applied between the cathode and the anode, electrons are injected into the light emitting layer from the cathode side, and holes are injected into the light emitting layer from the anode side.

At this time, in the case where a molecular structure of organic EL materials (light emitting layer materials) is a specific structure or an aggregation state of molecules of the organic EL materials is a specific state, the injected electrons cannot be combined with the injected holes immediately, and therefore the injected electrons and holes are retained for a certain period of time in a specific excitation state.

Therefore, in such a specific excitation state, total energy of the molecules increases only for an amount of excitation energy as compared to a ground state which is a normal state. Pairs of the electrons and the holes which are being retained in such a specific excitation state are referred to as exciter (exciton).

After a lapse of the certain period of time, when the exciter disintegrates and thereby the electrons are combined with the holes, the increased excitation energy is released to the outside of the organic EL device as heat and/or light.

The light is released in the vicinity of the light emitting layer. A quantity of the released light based on the excitation energy is affected by the molecular structure of the organic EL materials or the aggregation state of the molecules of the organic EL materials significantly.

In such an organic EL device, it has been known that a layered device structure, in which organic semiconductor layers formed of organic semiconductor materials having different carrier transport properties for carriers (electrons or holes) are provided between a light emitting layer and a cathode and/or an anode, is effective in obtaining high luminance.

In order to obtain high luminous efficiency in such an organic EL device having a structure in which a light emitting layer and an organic semiconductor layer are provided between an anode and a cathode, extensive researches and studies are conducted on molecular structures of organic EL materials and organic semiconductor materials to be used, aggregation states of molecules of these materials, a number of layers of the light emitting layer and the organic semiconductor layer, a laminated position thereof, and the like.

However, even in the organic EL devices modified as described above, characteristics such as luminous efficiency and the like are not so improved as to meet expectations in actuality (see JP-A H09-255774, for example).

Recently, the reason why such sufficient characteristics improvement cannot be obtained has been roughly known. Namely, in such organic EL devices, in the vicinity of an interface between a light emitting layer and an organic semiconductor layer and the vicinity of an interface between organic semiconductor layers which are different kinds, transfer of carriers is not carried out smoothly between the adjacent layers.

In this regard, it is supposed that the same problem occurs in the solar cell and the like.

SUMMARY

Accordingly, it is an object of the present invention to provide an electronic device having an intermediate layer which can transfer carriers between adjacent layers therethrough and having excellent properties, and electronic equipment provided with the electronic device and having high reliability.

The object is achieved by the present invention described below. In a first aspect of the present invention, there is provided an electronic device. The electronic device comprises a pair of electrodes and laminate layers provided between the electrodes.

The laminate layers comprise a first organic semiconductor layer constituted of a first organic semiconductor material as a main component thereof, a second organic semiconductor layer constituted of a second organic semiconductor material, whose polarity is lower than that of the first organic semiconductor material, as a main component thereof, and an intermediate layer provided between the first and second organic semiconductor layers so as to make contact with both of the first and second organic semiconductor layers.

The intermediate layer is constituted of a compound represented by a general formula $A^1$-B-$A^2$ (wherein, each of $A^1$ and $A^2$ is a group including at least one of a primary amino group, a secondary amino group, a tertiary amino group, a hydroxyl group, a carbonyl group and a carboxyl group, wherein $A^1$ and $A^2$ are the same or different, and optionally simultaneously exist, and wherein B is a group including a fluorene ring).

Molecules of the compound are oriented in a state that each group $A^1$ and each group $A^2$ are positioned on the side of the first organic semiconductor layer and each group B is positioned on the side of the second organic semiconductor layer.

This makes it possible to transfer carriers from the first organic semiconductor layer to the second organic semiconductor layer through the intermediate layer smoothly, and therefore it is possible to obtain an electronic device having excellent properties.

In the electronic device according to the present invention, it is preferred that the second organic semiconductor material is a fluorene derivative.

Since a fluorene ring contained in the fluorene derivative is constituted of hydrocarbon, a polarity of the fluorene derivative becomes relatively low.

In the electronic device according to the present invention, it is preferred that the first organic semiconductor material is an arylamine derivative.

Since the arylamine derivative includes an amine structure in a molecule thereof, a polarity of the arylamine derivative becomes relatively high.

In the electronic device according to the present invention, it is preferred that the group $A^1$ includes at least one of an aryl group and an alkyl group.

By containing the aryl group and/or the alkyl group in the group $A^1$, carrier transport ability of the group $A^1$ can be improved. As a result, the intermediate layer can exhibit high carrier transport ability.

In the electronic device according to the present invention, it is preferred that the group $A^2$ includes at least one of an aryl group and an alkyl group.

By containing the aryl group and/or the alkyl group in the group $A^2$, carrier transport ability of the group $A^2$ can be improved. As a result, the intermediate layer can exhibit high carrier transport ability.

In the electronic device according to the present invention, it is preferred that the group $A^1$ and the group $A^2$ are the same.

This makes it possible for both of the group $A^1$ and the group $A^2$ to be positioned on the side of the first organic semiconductor layer reliably. As a result, carriers can be more reliably transferred from the second organic semiconductor layer to the first organic semiconductor layer through the groups $A^1$ and $A^2$.

In the electronic device according to the present invention, it is preferred that a part of the compound is penetrated into the first organic semiconductor layer.

This makes it possible to further improve adhesion between the first organic semiconductor layer and the intermediate layer. As a result, carriers can be transferred from the first organic semiconductor layer to the intermediate layer more smoothly.

In the electronic device according to the present invention, it is preferred that a part of the compound is penetrated into the second organic semiconductor layer.

This makes it possible to further improve adhesion between the second organic semiconductor layer and the intermediate layer. As a result, carriers can be transferred from the second organic semiconductor layer to the intermediate layer more smoothly.

In the electronic device according to the present invention, it is preferred that an average thickness of the intermediate layer is 10 nm or less.

By setting the average thickness of the intermediate layer to a value within the above range, the intermediate layer can be formed relatively easily as a monomolecular film of the compound in which the molecules of the compound are oriented in a state that each group $A^1$ and each group $A^2$ are positioned on the side of the first organic semiconductor layer and each group B is positioned on the side of the second organic semiconductor layer.

In the electronic device according to the present invention, it is preferred that the laminated layers are obtained by laminating the layers successively from one of the first and second organic semiconductor layers.

This makes it possible to form an intermediate layer constituted of the compound as a main component thereof, in which the molecules of the compound are oriented in a state that each group $A^1$ and each group $A^2$ are positioned on the side of the first organic semiconductor layer and each group B is positioned on the side of the second organic semiconductor layer.

In the electronic device according to the present invention, it is preferred that the intermediate layer is formed using a liquid phase process, and molecules of the compound are oriented by utilizing a difference between affinity of each of the groups $A^1$ and $A^2$ for the one organic semiconductor layer and affinity of the group B for the one organic semiconductor layer.

In the electronic device according to the present invention, it is preferred that a material used for forming the intermediate layer is of the type that can dissolve or swell the one organic semiconductor layer.

This makes it possible to provide the molecules of the compound in a state that a part of the compound is penetrated into the first organic semiconductor layer.

In the electronic device according to the present invention, it is preferred that the other organic semiconductor layer is formed using a liquid phase process.

In the electronic device according to the present invention, it is preferred that a material used for forming the other organic semiconductor layer is of the type that can dissolve or swell the intermediate layer.

This makes it possible to provide the molecules of the compound in a state that a part of the compound is penetrated into the second organic semiconductor layer.

In the electronic device according to the present invention, it is preferred that the electronic device is an organic electroluminescence device, and the first organic semiconductor layer is a carrier transport layer and the second organic semiconductor layer is a light emitting layer.

This makes it possible to transfer carriers from the carrier transport layer to the light emitting layer through the intermediate layer more smoothly. As a result, it is possible to obtain an organic electroluminescence device having improved properties such as high luminous efficiency and the like.

In a second aspect of the present invention, there is provided electronic equipment. The electronic equipment is provided with the electronic device described above.

This makes it possible to obtain electronic equipment having high reliability.

DESCRIPTION OF EXEMPLARY EMBODIMENTS

Hereinbelow, an electronic device and electronic equipment provided with the electronic device according to the present invention will be described in detail based on preferred embodiments shown in the accompanying drawings.

In this regard, it is to be noted that the following description will be made based on one example of an organic electroluminescence device (hereinafter, simply referred to as an "organic EL device") to which the electronic device according to the present invention is applied.

Organic EL Device

Figure 1:
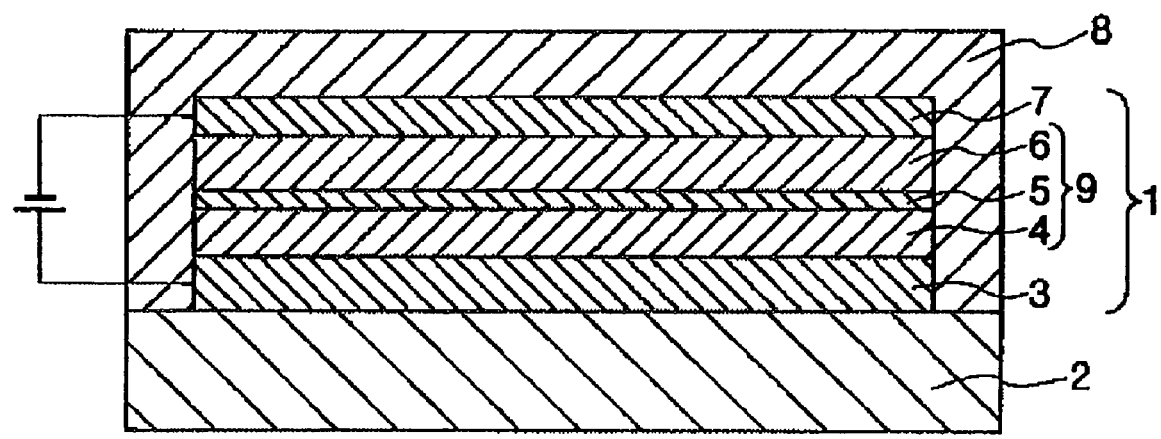
FIG. 1 is a vertical sectional view which shows one example of an organic EL device in accordance with the present invention.

FIG. 1 is a vertical sectional view which shows one example of an organic EL device in accordance with the present invention. In the following description, the upper side in FIG. 1 will be referred to as "upper" and the lower side thereof will be referred to as "lower" for convenience of explanation.

The organic EL device 1 shown in FIG. 1 is provided with an anode 3, an cathode 7, and laminated layers 9 provided between the anode 3 and the cathode 7 (that is, a pair of electrodes). The laminated layers 9 include a hole transport layer 4 (that is, a first organic semiconductor layer), an intermediate layer 5, and a light emitting layer 6 (that is, a second organic semiconductor layer), in which these layers 4, 5 and 6 are laminated in this order from the side of the anode 3. The whole of the organic EL device 1 is provided on a substrate 2 and is sealed by a sealing member 8.

The substrate 2 serves as a support for the organic EL device 1. It is to be noted that in the case where the organic EL device 1 has a structure in which light is emitted from the opposite side of the substrate 2 (that is, a top emission type), the substrate 2 and the anode 3 are not required to have transparency.

On the other hand, in the case where the organic EL device 1 has a structure in which light is emitted from the side of the substrate 2 (that is, a bottom emission type), both the substrate 2 and the anode 3 are respectively required to be formed of materials having substantially transparency (that is, transparent and colorless, colored and transparent, or translucent).

Examples of such a substrate 2 include: a transparent substrate formed of resin materials such as polyethylene terephthalate, polyethylene naphthalate, polypropylene, cycloolefin polymer, polyamide, polyethersulfone, polymethylmethacrylate, polycarbonate, and polyarylate, and glass materials such as quartz glass, and soda glass, and the like; a substrate formed of ceramic materials such as alumina; a substrate formed from a metal substrate such as stainless steel having a surface on which an oxide film (insulation film) is provided; and an opaque substrate such as a substrate formed of opaque resin materials.

An average thickness of such a substrate 2 is not particularly limited, but is preferably in the range of about 0.1 to 10 mm, and more preferably in the range of about 0.1 to 5 mm.

The anode 3 is an electrode which injects holes into the hole transport layer 4 described later.

Namely, as a constituent material of the anode 3 (hereinafter, referred to as "anode material"), materials having a high work function and excellent conductivity are preferably used from the viewpoint of its function that injects holes into the hole transport layer 4.

Examples of such an anode material include: oxides such as ITO (Indium Tin Oxide), IZO (Indium Zinc Oxide), $In_2O_3$, $SnO_2$, $SnO_2$ containing Sb, and ZnO containing Al; metals such as Au, Pt, Ag, Cu, Al, and alloys containing two or more of them; and the like. At least one kind of the above materials may be used as the anode material.

An average thickness of the anode 3 is not limited to any specific value, but is preferably in the range of about 10 to 200 nm, and more preferably, in the range of about 50 to 150 nm. If the thickness of the anode 3 is too thin, there is a fear that a function of the anode 3 will not be sufficiently exhibited. On the other hand, if the anode 3 is too thick, there is a fear that the luminous efficiency of the organic EL device 1 will be significantly lowered.

Further, it is preferred that a surface resistance of the anode 3 is as low as possible. Specifically, it is preferably 100Ω/□ or less, and more preferably 50Ω/□ or less. A lower limit value of the surface resistance is not particularly limited, but normally it is preferably about 0.1Ω/□.

The cathode 7 is an electrode which injects electrons into the light emitting layer 6 described later. Materials having a low work function are preferably used as a constituent material of the cathode 7.

Examples of such a constituent material of the cathode 7 (hereinafter, referred to as "cathode material") include thermal decomposition products of cesium oxide or cesium carbonate, Li, Na, K, Rb, Cs, Be, Mg, Ca, Sr, Ba, Sc, Y, La, Ce, Eu, Er, Yb, Ag, Zn, Cu, Al, alloys containing two or more of them, and the like. Two or more of these materials may be used in combination.

Especially, in the case where an alloy is used as the cathode material, alloys containing stable metal elements such as Ag, Al and Cu (specifically, alloys such as MgAg, AlLi and CuLi) are preferably used. By using such an alloy as the cathode material, it is possible to improve injection efficiency of electrons of the cathode 7 and stability of the cathode 7.

In this regard, it is to be noted that the cathode 7 may be formed from a laminated body having a plurality of layers. In this case, it is preferred that a layer to be provided near the intermediate layer 5 is formed of a cathode material having a lower work function.

In the case where the cathode 7 is formed from a laminated body having two layers, it is preferred that a layer provided far from the intermediate layer 5 is formed of a material containing Ca as a main component thereof, and a layer provided near the intermediate layer 5 is formed of a material containing Al, Ag or alloys as a main component thereof.

An average thickness of such a cathode 7 is not particularly limited, but is preferably in the range of about 1 to 1000 nm, and more preferably in the range of about 100 to 400 nm. If the thickness of the cathode 7 is too thin, a voltage drop is likely to occur due to increase of resistivity or decrease of electrical conductivity. This tendency becomes remarkable due to oxidation reaction of the cathode material. As a result, there is a fear that a function of the cathode 7 will not be sufficiently exhibited.

On the other hand, if the cathode 7 is too thick, in the case where the cathode 7 is formed using a vacuum deposition method or a sputtering method, a temperature inside the formed layer remarkably increases during formation of the cathode 7 or residual stress is increased within the formed cathode 7.

As a result, there is a fear that breaking of the light emitting layer 6 which is to be provided as an under layer (which will be described later) occurs, or the cathode 7 and the light emitting layer 6 is separated from the intermediate layer 5. If such breaking or separation occurs, the luminous efficiency of the organic EL device 1 will be significantly lowered.

As is the same with the anode 3, it is preferred that a surface resistance of the cathode 7 is as lower as possible. Specifically, it is preferably 50Ω/□ or less, and more preferably 20Ω/□ or less. A lower limit value of the surface resistance is not particularly limited, but normally it is preferably at about 0.1Ω/□.

As described above, the laminated layers 9 are provided between the anode 3 and the cathode 7 in contact with them, respectively. The laminated layers 9 include the hole transport layer 4, the intermediate layer 5 and the light emitting layer 6, in which these layers 4, 5, 6 are laminated in this order from the side of the anode 3.

The hole transport layer 4 has a function of transporting holes, which are injected from the anode 3, to the intermediate layer 5.

In this embodiment, the hole transport layer 4 is constituted of an arylamine derivative as a main component thereof. Since the arylamine derivative has conjugated structures, such an arylamine derivative can transport holes especially smoothly due to a characteristic derived from its unique spread of the electron cloud.

As a result, by forming the hole transport layer 4 using the arylamine derivative as a main component thereof, the hole transport layer 4 can have especially excellent hole transport ability. Further, the arylamine derivative has a relatively high polarity due to inclusion of an amine structure in a molecule thereof.

In this regard, it is to be noted that in the case where the hole transport layer 4 is formed of a low molecular arylamine derivative as a main component thereof, a dense hole transport layer 4 can be obtained, so that hole transport efficiency of the hole transport layer 4 can be improved.

On the other hand, in the case where the hole transport layer 4 is formed of a high molecular arylamine derivative as a main component thereof, the hole transport layer 4 can be formed using various application methods such as an ink-jet printing method, a spin coating method, and the like, since such a high molecular arylamine derivative is dissolved in a solvent relatively easily.

Further, in the case where the low molecular arylamine derivative is used in combination with the high molecular arylamine derivative, it is possible to obtain a synergistic effect that a dense hole transport layer 4 having the excellent hole transport efficiency can be formed relatively easily using various application methods such as an ink-jet printing method, and the like.

Examples of such a low molecular arylamine derivative include a monomer or an oligomer of 1,1-bis(4-di-para-tri-aminophenyl)cyclohexane, 1,1'-bis(4-di-para-tolylami-nophenyl)-4-phenyl-cyclohexane, 4,4',4"-trimethyltriphenyl-amine, N,N,N',N'-tetraphenyl-1,1'-biphenyl-4,4'-diamine, N,N'-diphenyl-N,N'-bis(3-methylphenyl)-1,1'-biphenyl-4,4'-diamine(TPD1), N,N'-diphenyl-N,N'-bis(4-methoxyphenyl)-1,1'-biphenyl-4,4'-diamine(TPD2), N,N,N',N'-tetrakis(4-methoxyphenyl)-1,1'-biphenyl-4,4'-diamine(TPD3), N,N'-di(1-naphthyl)-N,N'-diphenyl-1,1'-biphenyl-4,4'-diamine(α-NPD), TPTE, N,N,N',N'-tetraphenyl-para-phenylenediamine, N,N,N',N'-tetra(para-tolyl)-para-phenylenediamine, N,N,N',N'-tetra(meta-tolyl)-meta-phenylenediamine(PDA), para-(9-anthryl)-N,N-di-para-tolyl aniline, and the like.

Examples of the high molecular arylamine derivative include (1) a polymer or a prepolymer which can be obtained by polymerizing a monomer having any one of the low molecular arylamine derivatives mentioned above in a main chain or a side chain thereof, and (2) a polymer or a prepolymer which can be obtained by polymerizing an oligomer having any one of the low molecular arylamine derivatives in a main chain or a side chain thereof, and the like.

An average thickness of the hole transport layer 4 is not limited to any specific value, but it is preferably in the range of about 10 to 150 nm, and more preferably in the range of about 50 to 100 nm. If the thickness of the hole transport layer 4 is too thin, there is a fear that pin holes are to be formed. On the other hand, if the thickness of the hole transport layer 4 is too thick, it may result in a reduced transmittance of the hole transport layer 4, thus leading to the case where chromaticity (hue) of emitted light is adversely changed.

The intermediate layer 5 has a function of transporting electrons, which are injected from the anode 3, to the light emitting layer 6.

In this embodiment, the hole transport layer 4 is constituted of the above arylamine derivative as a main component thereof, whereas the light emitting layer 6 is constituted of a fluorene derivative described below as a main component thereof. Since the arylamine derivative has large bias of electron distribution in an electron cloud thereof due to inclusion of an amine structure in a molecule thereof, the arylamine derivative has a polarity larger than that of the fluorene derivative.

As a result, if the hole transport layer 4 and the light emitting layer 6 are formed so as to make contact with each other without providing the intermediate layer 5, repulsive force (interfacial tension) between the arylamine derivative and the fluorene derivative occurs at an interface between the hole transport layer 4 and the light emitting layer 6.

In other words, interaction between similar materials becomes larger than interaction between different materials.

As a result, a distance between molecules of the arylamine derivative and molecules of the fluorene derivative becomes large. This prevents sufficient adhesion from being made between the hole transport layer 4 and the light emitting layer 6. This causes a problem in that electrons are not transferred between the hole transport layer 4 and the light emitting layer 6 smoothly due to increase of resistance therebetween.

On the other hand, in the organic EL device 1 (that is, the electronic device of the present invention), the intermediate layer 5 having a specific structural characteristic is provided between the hole transport layer 4 and the light emitting layer 6 so as to make contact with both of the hole transport layer 4 and the light emitting layer 6.

Namely, in the organic EL device 1, the intermediate layer 5 constituted of a compound represented by a general formula $A^1$-B-$A^2$ (hereinafter, the compound will be referred to as "compound (1)") as a main component thereof is provided between the hole transport layer 4 and the light emitting layer 6. In this compound (1), each of the $A^1$ and $A^2$ is a group including at least one of a primary amino group, a secondary amino group, a tertiary amino group, a hydroxyl group, a carbonyl group and a carboxyl group, the $A^1$ and $A^2$ are the same or different, and optionally (may or may not) simultaneously exist, and the B is a group including a fluorene ring.

And in the intermediate layer 5, molecules of the compound (1) are oriented (that is, the compound (1) is oriented) in a state that each group $A^1$ and each group $A^2$ are positioned on the side of the hole transport layer (first organic semiconductor layer) 4 and each group B is positioned on the side of the light emitting layer (second organic semiconductor layer) 6.

Here, as described in the above, since the groups $A^1$ and $A^2$ positioned on the side of the hole transport layer 4 include at least one of a primary amino group, a secondary amino group, a tertiary amino group, a hydroxyl group, a carbonyl group and a carboxyl group, the group $A^1$ and group $A^2$ have a polarity.

As described above, since the arylamine derivative, which is a main component of the hole transport layer 4, includes an amine structure having a polarity in a molecule thereof, each of the groups $A^1$ and $A^2$ exhibits excellent affinity for the arylamine derivative.

As a result, a distance between molecules of the arylamine derivative and molecules of the compound (1) can be decreased. This makes it possible to obtain sufficient adhesion between the hole transport layer 4 and the intermediate layer 5. For this reason, holes can be transferred from the hole transport layer 4 to the intermediate layer 5 smoothly.

Further, since both of the group B, which is positioned on the side of the light emitting layer 6, and the fluorene derivative, which is a main component of the light emitting layer 6, have at least one fluorene ring, the group B exhibits affinity for the fluorene derivative.

As a result, a distance between molecules of the compound (1) and molecules of the fluorene derivative can be decreased. This makes it possible to obtain sufficient adhesion between the intermediate layer 5 and the light emitting layer 6. For this reason, holes can be transferred from the intermediate layer 5 to the light emitting layer 6 smoothly.

For these reasons, by providing the intermediate layer 5 having such a structure between the hole transport layer 4 and the light emitting layer 6, holes can be transferred from the hole transport layer 4 to the intermediate layer 5, and further from the intermediate layer 5 to the light emitting layer 6 smoothly.

Namely, holes can be transferred from the hole transport layer 4 to the light emitting layer 6 through the intermediate layer 5 smoothly. As a result, it is possible to obtain an organic EL device 1 having improved properties such as high luminous efficiency and the like.

In such an intermediate layer 5, the compound (1) may merely make contact with the hole transport layer 4, but it is preferred that a part thereof (a part of the side of each of the groups $A^1$ and $A^2$) is penetrated into the hole transport layer 4. This makes it possible to further improve adhesion between the hole transport layer 4 and the intermediate layer 5. As a result, holes can be transferred from the hole transport layer 4 to the intermediate layer 5 more smoothly.

Further, the compound (1) may also merely make contact with the light emitting layer 6, but it is preferred that a part thereof (a part of the side of the group B) is penetrated into the light emitting layer 6. This makes it possible to further improve adhesion between the intermediate layer 5 and the light emitting layer 6. As a result, holes can be transferred from the intermediate layer 5 to the light emitting layer 6 more smoothly.

A structure of the compound (1) is configured (determined) so that its molecules can be oriented in a state that the groups $A^1$ and $A^2$ are positioned on the side of the hole transport layer 4 and the group B is positioned on the side of the intermediate layer 5 within the intermediate layer 5.

The group $A^1$ is not particularly limited to a specific type insofar as it has a polarity, but it is preferred that the group $A^1$ includes at least one of an aryl group and an alkyl group, in addition to at least one of a primary amino group, a secondary amino group, a tertiary amino group, a hydroxyl group, a carbonyl group and a carboxyl group.

Since the arylamine derivative includes a large number of the above groups in a structure thereof, affinity between the group $A^1$ including the above groups and the arylamine derivative can be further improved. This makes it possible to further improve adhesion between the hole transport layer 4 and the intermediate layer 5.

Further, since the group $A^1$ including the above groups has excellent hole transport ability, it is possible to obtain an intermediate layer 5 which can exhibit excellent hole transport ability.

In the same manner as the group $A^1$, the group $A^2$ is not also particularly limited to a specific type, but it is preferred that the group $A^1$ includes at least one of an aryl group and an alkyl group, in addition to at least one of a primary amino group, a secondary amino group, a tertiary amino group, a hydroxyl group, a carbonyl group and a carboxyl group. This also makes it possible to obtain the same effect as described above.

Further, the group $A^1$ and the group $A^2$ may be different from each other, but it is preferred that the group $A^1$ and the group $A^2$ are the same. This makes it possible to for both of the group $A^1$ and the group $A^2$ to be positioned on the side of the hole transport layer 4. As a result, holes can be transferred from the hole transport layer 4 to the intermediate layer 5 through the groups $A^1$ and $A^2$ more reliably.

Examples of such groups $A^1$ and $A^2$ include a group including a triphenyl amine structure, a group including a carbazole structure, and the like.

In this case, the groups $A^1$ and $A^2$ may include any one of the above structures. Further, the groups $A^1$ and $A^2$ may also include a plurality of the above structures, that is, have repeated structural units including the triphenyl amine structure and/or the carbazole structure.

Further, the group B may include one fluorene ring or a plurality of fluorene rings.

Furthermore, molecules of the compound (1) may be bonded with each other via binding groups. Namely the adjacent molecules of the compound (1) may be bonded with each other by bonding the groups B via the binding group.

Specifically, examples of such a compound (1) include 1,4-bis(9-ethyl-3-carbazovinylene)-9,9-dihexyl-fluorene, a compound in which N,N-bis(4-methylphenyl)-4-anylines are bonded to both ends of poly(9,9-dioctylfluorenyl-2,7-diyl), respectively, poly[(9,9-di(3,3'-N,N-trimethylammonium) propylfluorenyl-2,7-diyl)-alt-(1,4-biphenylene)]-3,5-dimethylphenyl diiodido, 9-fluorenol, and the like.

In this regard, it is to be noted that the intermediate layer 5 may be constituted of any one of the above compounds (I) or may be constituted of in combination of two or more of the above compounds (I).

An average thickness of the intermediate layer 5 may slightly varies depending on the structure of the compound (1), but is preferably 10 nm or less, and more preferably in the range of about 1 to 5 nm.

By setting the average thickness of the intermediate layer 5 to a value within the above range, the intermediate layer 5 can be formed relatively easily as a monomolecular film in which the molecules of the compound (1) are oriented (that is, the compounds (1) are oriented) in a state that each group $A^1$ and each group $A^2$ are positioned on the side of the hole transport layer 4 and each group B is positioned on the side of the light emitting layer 6, respectively.

As a result, since transfer of holes is carried out in one molecule of the compound (1) in a thickness direction of the intermediate layer 5, the holes can be transferred from the hole transport layer 4 to the light emitting layer 6 through the intermediate layer 5 more smoothly.

When current flows between the anode 3 and the cathode 7 (that is, voltage is applied between the anode 3 and the cathode 7), holes move in the hole transport layer 4 and electrons move in the light emitting layer 6 and therefore excitons (exciters) are produced mainly at the vicinity of the boundary between the light emitting layer 5 and the hole transport layer 4 through the combining process of the holes injected from the intermediate layer 5 and the electrons.

The excitons are recombined in a certain period of time. At that time, excitation energy accumulated in the process of the production of the excitons is released as light such as fluorescence, phosphorescence, or the like. This is electroluminescence emission.

In this embodiment, the light emitting layer 6 is constituted of a fluorene derivative as a main component thereof. This makes it possible to inject holes into the light emitting layer 6 from the side of the anode 3 and inject electrons into the light emitting layer 6 from the cathode 7 when a voltage is applied between the anode 3 and the cathode 7.

In other words, the light emitting layer 6 can serve reliably as a field in which the holes and the electrons can be recombined. Further, since a fluorene ring is constituted of hydrocarbon, the fluorene derivative has a relatively low polarity.

In this regard, it is to be noted that in the case where the light emitting layer 6 is formed of a low molecular fluorene derivative as a main component thereof, a dense light emitting layer 6 can be obtained, thereby enabling the luminous efficiency of the light emitting layer 6 to be increased.

On the other hand, in the case where the light emitting layer 6 is formed of a high molecular fluorene derivative as a main component thereof, it is possible to form a light emitting layer 6 easily using any one of various application methods such as an ink-jet printing method and the like since such a fluorene derivative is dissolved into a solvent relatively easily.

Further, when the low molecular fluorene derivative are used in combination with the high molecular fluorene derivative, it is possible to obtain a synergistic effect that a dense light emitting layer 6 having the high luminous efficiency can be easily formed by using various application methods such as an ink-jet printing method and the like.

Examples of such a fluorene derivative include: monomers such as 2,2',7,7'-tetraphenyl-9,9'-spirobifluorene; polymers such as poly(9,9-dihexyl-2,7-vinylenefluorenylene), poly(9,9-dialkylfluorene) (PDAF), α,ω-bis[N,N'-di(methylphenyl)aminophenyl]-poly[9,9-bis(2-ethylhexyl)fluorene-2,7-diyl] (PF2/6am4), poly(9,9-dioctyl-2,7-divinylenefluorenyl-ortho-co(anthracene-9,10-diyl)), poly(9,9-dioctyl-2,7-divinylenefluorenyl-ortho-co(biphenylene-4,4'-diyl)), poly[{9,9-dioctylfluorenyl-2,7-diyl}-co-{1,4-(2,5-dimethoxy)benzene}], 2,7-bis(9,9-bis(2-methylbutyl)-9',9'',9''',9''''-tetrakis(n-propyl)-7,2';7'2''-terfluorene-2-yl)-9,9-bis(n-propyl)fluorine; and the like.

An average thickness of the light emitting layer 6 is not limited to any specific value, but is preferably in the range of about 10 to 150 nm, and more preferably in the range of about 50 to 100 nm. By setting the thickness of the light emitting layer 6 to a value within the above range, the recombination of the holes and the electrons efficiently occurs, thereby enabling the luminous efficiency of the light emitting layer 6 to be further improved.

In this regard, it is to be noted that the light emitting layer 6 is not limited to a single layer. For example, the light emitting layer 6 may be formed into a multilayer structure in which an electron transport layer having excellent electron transport ability is provided in the light emitting layer 6 in contact with the cathode 7. The light emitting layer 6 having such a structure makes it possible to further improve the electron transport ability of the light emitting layer.

Examples of materials (electron transport materials) that can be used for the electron transport layer 6 are not particularly limited, but include: benzene-based compounds (star-burst-based compounds) such as 1,3,5-tris[(3-phenyl-6-trifluoromethyl)quinoxaline-2-yl]benzene (TPQ1), and 1,3,5-tris[{3-(4-t-butylphenyl)-6-trisfluoromethyl}quinoxaline-2-yl]benzene (TPQ2); naphthalene-based compounds such as naphthalene; phenanthrene-based compounds such as phenanthrene; chrysene-based compounds such as chrysene; perylene-based compounds such as perylene; anthracene-based compounds such as anthracene; pyrene-based compounds such as pyrene; acridine-based compounds such as acridine; stilbene-based compounds such as stilbene; thiophene-based compounds such as BBOT; butadiene-based compounds such as butadiene; coumarin-based compounds such as coumarin; quinoline-based compounds such as quinoline; bistyryl-based compounds such as bistyryl; pyrazine-based compounds such as pyrazine and distyrylpyrazine; quinoxaline-based compounds such as quinoxaline; benzoquinone-based compounds such as benzoquinone, and 2,5-diphenyl-para-benzoquinone; naphthoquinone-based compounds such as naphthoquinone; anthraquinone-based compounds such as anthraquinone; oxadiazole-based compounds such as oxadiazole, 2-(4-biphenylyl)-5-(4-t-butylphenyl)-1,3,4-oxadiazole (PBD), BMD, BND, BDD, and BAPD; triazole-based compounds such as triazole, and 3,4,5-triphenyl-1,2,4-triazole; oxazole-based compounds; anthrone-based compounds such as anthrone; fluorenone-based compounds such as fluorenone, and 1,3,8-trinitro-fluorenone (TNF); diphenoquinone-based compounds such as diphenoquinone, and MBDQ; stilbenequinone-based compounds such as stilbenequinone, and MBSQ; anthraquinodimethane-based compounds; thiopyran dioxide-based compounds; fluorenylidenemethane-based compounds; diphenyldicyanoethylene-based compounds; florene-based compounds such as florene; metallic or non-metallic phthalocyanine-based compounds such as phthalocyanine, copper phthalocyanine, and iron phthalocyanine; and various metal complexes such as 8-hydroxyquinoline aluminum ($Alq_3$), and complexes having benzooxazole or benzothiazole as a ligand. These compounds may be used at least one of them.

The sealing member 8 is provided so as to cover the anode 3, the hole transport layer 4, the light emitting layer 6, the intermediate layer 5, and the cathode 7. In this way, the sealing member 8 has a function of hermetically sealing these layers and shutting off the oxygen and the moisture.

By providing such a sealing member 8, it is possible to suppress or prevent the oxidation of the cathode 7, so that it is possible to obtain the effects that improve the reliability of the organic EL device 1 or prevent the organic EL device 1 from deteriorating or making alteration (that is, the organic EL device 1 can have improved durability).

Examples of a constituent material of the sealing member 8 include Al, Au, Cr, Nb, Ta and Ti, alloys containing them, a glass material containing silicon oxide, various resin materials, and the like.

Further, the sealing member may be formed into a flat plate shape, and provided on the cathode 7 so as to face the substrate 2 so that a space is created between the sealing member and around the layers, and then the space is filled with a seal material such as thermosetting resin or the like to thereby seal the organic EL device 1.

In this organic EL device 1, when a voltage of 0.5 V is applied between the anode 3 and the cathode 7 so that the cathode 7 is negative and the anode 3 is positive, it is preferred that the organic EL device 1 has a characteristic that a resistance value is preferably 100 $\Omega/cm^2$ or more, and more preferably 1 $k\Omega/cm^2$ or more.

The characteristic of the organic EL device 1 described above means that occurrence of short circuit (leakage of current) between the cathode 7 and the anode 3 is appropriately prevented or suppressed. Therefore, an organic EL device having such a characteristic can have especially high luminous efficiency.

In the present embodiment described above, an explanation was made with regard to the case where the hole transport layer 4 (first organic semiconductor layer) is constituted of the arylamine derivative as a main component thereof and the light emitting layer 6 (second organic semiconductor layer) is constituted of the fluorene derivative as a main component thereof.

However, a combination of a constituent material of the first organic semiconductor layer and a constituent material of the second organic semiconductor layer is not limited to the above combination. Namely, in the same manner as the relation of the arylamine derivative and the fluorene derivative, the main component of the first organic semiconductor layer and the main component of the second organic semiconductor layer should satisfy a relation that a polarity of the former becomes lower than that of the latter.

Examples of the combination of materials satisfying the above relation include: a combination of arylanthracene derivative and at least one of porphyrin metallic salt, amide thereof, and sulfonic acid derivative thereof; a combination of fluorofluorene derivative and at least one of phthalocyanine metallic salt, amide thereof, and sulfonic acid derivative thereof; a combination of a polyphenylenevinylene-based material and a cyanine-based material; a combination of a vinylcarbazole-based material and phenazine derivative; and the like.

Further, in the present embodiment described above, an explanation was made with regard to the case where the organic EL device 1 has the intermediate layer 5 provided between the hole transport layer 4 and the light emitting layer 6 so as to make contact with both of the hole transport layer 4 and the light emitting layer 6.

However, the present invention is not limited to such a case. In the present invention, for example, in the case where the organic EL device 1 has an electron transport layer, the intermediate layer may be provided between the electron transport layer and the light emitting layer 6 so as to make contact with both of the electron transport layer and the light emitting layer 6.

Further, in the case where the intermediate layer is provided between the electron transport layer and the light emitting layer 6, the intermediate layer 6 to be provided between the hole transport layer 4 and the light emitting layer 6 may be omitted.

Such an organic EL device 1 can be manufactured as follows.

<1> Step of Forming an Anode

First, a substrate 2 is prepared, and then an anode 3 is formed on the substrate 2.

The anode 3 can be formed by, for example, chemical vapor deposition (CVD) such as plasma CVD, thermal CVD, and laser CVD, vacuum deposition, sputtering, dry plating such as ion plating, wet plating such as electrolytic plating, immersion plating, and electroless plating, thermal spraying, a sol-gel method, a MOD method, bonding of a metallic foil, or the like.

<2> Step of Forming a Hole Transport Layer

Next, a hole transport layer 4 is formed on the anode 3.

The hole transport layer 4 can be formed, for example, by supplying a hole transport layer material which is prepared by dissolving any one of the arylamine derivatives as described above in a solvent or dispersing any one of the arylamine derivatives as described above in a dispersion medium onto the anode 3, and then removing the solvent or the dispersion medium contained in the hole transport layer material.

Various methods can be used for supplying the hole transport layer material onto the anode 3. Examples of such methods include application methods (liquid phase processes) such as an ink-jet method, a spin coating method, a liquid source misted chemical deposition method (LSMCD method), a casting method, a micro gravure coating method, a gravure coating method, a bar coating method, a roll coating method, a wire-bar coating method, a dip coating method, a spray coating method, a screen printing method, a flexographic printing method, an offset printing method, and a micro contact printing method, and the like, and these methods can be employed singly or in combination of two or more of them.

Examples of the solvent or dispersion medium that can be used for preparing the hole transport layer material include: inorganic solvents such as nitric acid, sulfuric acid, ammonia, hydrogen peroxide, water, carbon disulfide, carbon tetrachloride, and ethylene carbonate; and various organic solvents such as ketone-based solvents e.g., methyl ethyl ketone (MEK), acetone, diethyl ketone, methyl isobutyl ketone (MIBK), methyl isopropyl ketone (MIPK), and cyclohexanone, alcohol-based solvents e.g., methanol, ethanol, isopropanol, ethylene glycol, diethylene glycol (DEG), and glycerol, ether-based solvents e.g., diethyl ether, diisopropyl ether, 1,2-dimethoxy ethane (DME), 1,4-dioxane, tetrahydrofuran (THF), tetrahydropyran (THP), anisole, diethylene glycol dimethyl ether (diglyme), and diethylene glycol ethyl ether (Carbitol), cellosolve-based solvents e.g., methyl cellosolve, ethyl cellosolve, and phenyl cellosolve, aliphatic hydrocarbon-based solvents e.g, hexane, pentane, heptane, and cyclohexane, aromatic hydrocarbon-based solvents e.g., toluene, xylene, benzene, trimethylbenzene, and tetramethylbenzene, aromatic heterocyclic compound-based solvents e.g., pyridine, pyrazine, furan, pyrrole, thiophene, and methylpyrrolidone, amide-based solvents e.g., N,N-dimethylformamide (DMF) and N,N-dimethylacetamide (DMA), halogen compound-based solvents e.g., dichloromethane, chloroform, and 1,2-dichloroethane, ester-based solvents e.g., ethyl acetate, methyl acetate, and ethyl formate, sulfur compound-based solvents e.g., dimethyl sulfoxide (DMSO) and sulfolane, nitrile-based solvents e.g., acetonitrile, propionitrile, and acrylonitrile, organic acid-based solvents e.g., formic acid, acetic acid, trichloroacetic acid, and trifluoroacetic acid, and mixed solvents containing them.

<3> Step of Forming an Intermediate Layer

Next, an intermediate layer 5 is formed on the hole transport layer 4.

As a method for forming the intermediate layer 5, various methods can be used. Examples of such methods include: <I> a method in which a liquid material containing the compound (1) is applied onto the hole transport layer 4 using a liquid phase process; <II> a method in which the compound (1) is applied onto the hole transport layer 4 using a vapor phase process (vapor phase film formation method) such as a vacuum deposition method, a sputtering method or a cluster ion beam method; <III> a method in which a thin molecular film composed of oriented molecules of the compound (1) is formed on the surface of a liquid, a substrate on which the hole transport layer 4 has been formed is softly immersed into the liquid, and then the substrate is pulled out from the liquid so that the thin molecular film is provided on the surface of the substrate (hole transport layer 4); and <IV> a method in which a thin molecular film composed of oriented molecules of the compound (I) is formed on the surface of a liquid, and then a substrate on which the hole transport layer 4 has been formed is softly brought into contact with the thin molecular film so that the thin molecular film is transferred on the surface of the substrate (hole transport layer 4). Two or more of these methods may be used in combination.

Among these methods, the method <1> is preferably used as the method for forming the intermediate layer 5. According to such a method, the intermediate layer 5 can be formed relatively easily without using a large scale manufacturing apparatus. Further, use of the method <1> makes it possible to orient reliably the molecules of the compound (1) due to a difference between affinity of each of the groups $A^1$ and $A^2$ for the arylamine derivative and affinity of the group B for the arylamine derivative.

Hereinbelow, the case where the intermediate layer 5 is formed by using the method <1> will be described.

<3-1> First, a liquid material containing the compound (1) is prepared.

In this regard, it is to be noted that the liquid material may be any one of a liquid solution in which the compound (1) is dissolved into a solvent and a dispersion liquid in which the compound (1) is dispersed into a dispersion medium, but the liquid solution is more preferable. By selecting the liquid solution as the liquid material, the compound (1) can be oriented reliably in the next step <3-2>.

In this regard, it is to be noted that a solvent or dispersion medium, which is of the type that is difficult to dissolve the material for forming the hole transport layer 4 (that is, the arylamine derivative), may be used as the solvent or dispersion medium.

The solvent or dispersion medium to be used for preparing the liquid material may be selected from the solvents or dispersion mediums mentioned above with reference to the step <2>.

A concentration of the compound (1) in the liquid material varies slightly depending on the kinds of the compounds (I) to be used, but is preferably in the range of about 0.001 to 0.5 mol/L, and more preferably in the range of about 0.01 to 0.1 mol/L. By setting the concentration of the compound (1) in the liquid material to a value within the above range, when the liquid material is dried in a subsequent step <3-3>, the intermediate layer 5 can be obtained reliably easily as a monomolecular film constituted of the compound (1).

In this regard, it is to be noted that in the case where the compound (1) is in a liquid form and of the type that is difficult to dissolve the material for forming the hole transport layer 4 (that is, the arylamine derivative), the compound (1) itself can be used as the liquid material without adding the above solvent or dispersion medium.

<3-2> Next, the liquid material is applied onto the hole transport layer 4.

Here, the polarity of each of the groups $A^1$ and $A^2$ is higher than that of the group B, and the arylamine derivative which is a main component of the hole transport layer 4 has a relatively high polarity. Therefore, the arylamine derivative exhibits high affinity for each of the groups $A^1$ and $A^2$ as compared with the group B.

As a result, the molecules of the compound (1) are oriented in a state that each group $A^1$ and each group $A^2$ are positioned on the side of the intermediate layer 5 adjacent to the hole transport layer 4 and each group B is positioned on the opposite side of the intermediate layer 5.

As a method for applying the liquid material onto the light emitting layer 6, the liquid phase processes as described in the above step <2> can be used.

In this regard, it is to be noted that a liquid material, which is of the type that can dissolve (phase dissolve) or swell moderately the hole transport layer 4 (that is, the arylamine derivative), may be used as the liquid material. In this case, the vicinity of the upper surface of the hole transport layer 4 can be dissolved or swelled to a certain extent due to use of such a liquid material.

This makes it possible to provide the compound (1) in a state that a part thereof (groups $A^1$ and $A^2$) is penetrated into the hole transport layer 4. Therefore, adhesion between the hole transport layer 4 and the intermediate layer 5 to be formed in the next step <3-3> can be further improved.

<3-3> Next, the liquid material applied on the hole transport layer 4 is dried.

In this way, it is possible to obtain an intermediate layer 5 in which the molecules of the compound (1) are oriented in a state that each group $A^1$ and each group $A^2$ are positioned on the side of the intermediate layer 5 adjacent to the hole transport layer 4 and each group B is positioned on the opposite side of the intermediate layer 5.

A method for drying the liquid material is not particularly limited, but artificial drying methods such as a drying method by heating and a suction drying method, as well as a natural drying method may be used.

In the case of using the artificial drying methods, a temperature of the ambience during drying processing is, preferably in the range of about 20 to 90° C., and more preferably in the range of about 50 to 80° C.

A pressure of the ambience during drying processing is preferably in the range of about 0.1 to 10 Pa, and more preferably in the range of about 1 to 5 Pa.

The processing time varies depending on a material for forming the intermediate layer 5, but is preferably in the range of about 1 to 90 minutes, and more preferably in the range of about 5 to 30 minutes.

By setting the temperature and the pressure of the ambience and the processing time to values within the above ranges, the liquid material can be dried appropriately so that the intermediate layer 5 is formed reliably.

In this regard, it is to be noted that the dried intermediate layer 5 may be subjected to post-treatments such as a heat treatment and a mechanical oriented treatment. Such a mechanical oriented treatment is carried out by physically rubbing the upper surface of the intermediate layer 5 with a cloth made of soft fibers in one direction thereof softly and repeatedly.

This makes it possible to stabilize a state that the molecules of the compound (1) are oriented within the intermediate layer 5. Namely, the molecules of the compound (1) can be more reliably oriented in a state that each group $A^1$ and each group $A^2$ are positioned on the side of the intermediate layer 5 adjacent to the hole transport layer 4 and each group B is positioned on the opposite side of the intermediate layer 5.

<4> Step of Forming a Light Emitting Layer

Next, a light emitting layer 6 is formed on the intermediate layer 5.

The light emitting layer 6 can be formed using the same method described above with reference to the hole transport layer 4. In other words, the light emitting layer 6 can be formed by using the liquid phase process as described above with reference to the step of forming the hole transport layer <2> using any one or more of the light emitting materials described above.

In this regard, it is to be noted that a liquid material, which is of the type that can dissolve (phase dissolve) or swell the intermediate layer 5 (that is, compound (1)), may be used as a material for forming the light emitting layer 6. In this case, the vicinity of the upper surface of the intermediate layer 5 can be dissolved or swelled due to use of such a liquid material.

This makes it possible to provide the compound (1) in a state that a part thereof (group B) is penetrated into the light emitting layer 6. Therefore, adhesion between the intermediate layer 5 and the light emitting layer 6 can be further improved.

<5> Step of Forming a Cathode

Next, a cathode 7 is formed on the thus formed light emitting layer 6. Namely, the light emitting layer 6 has one surface and the other surface which is opposite to the one surface and makes contact with the intermediate layer 5, and the cathode 7 is formed on the one surface of the light emitting layer 6.

The cathode 7 can be formed by using a vacuum deposition method, a sputtering method, a cluster ion beam method or the like.

<6> Step of Forming a Sealing Member

Next, a sealing member 8 is formed so as to cover the anode 3, the hole transport layer 4, the intermediate layer 5, the light emitting layer 6, and the cathode 7.

The sealing member 8 may be formed (or provided) by bonding a box-shaped protective cover constituted of any one of the materials mentioned above onto the laminated body including these layers 3, 4, 5, 6 and 7 with a curable resin (adhesive).

As for such a curable resin, any of thermosetting resins, photocurable resins, reactive curable resins, or anaerobic curable resins may be used.

the organic EL device 1 is manufactured through the above steps.

In the present embodiment described above, an explanation was made with regard to the case where the organic EL device 1 is manufactured by laminating the anode 3, the hole transport layer 4, the intermediate layer 5, the light emitting layer 6 and the cathode 7 on the substrate 2 in this order, and then sealing these layers by the sealing member 8. However, the present invention is not limited to such a method for manufacturing the organic EL device 1. In the present invention, for example, the organic EL device 1 may be manufactured as follows.

Namely, first a flat plate member is prepared as the sealing member 8. Next, the cathode 7, the light emitting layer 6, the intermediate layer 5, the hole transport layer 4 and the anode 3 are laminated on the sealing member 8 in this order. And then the substrate 2 is provided on the anode 3 so as to face the sealing member 8 so that a space is created between the sealing member 8 and around the layers. Thereafter, the space is filled with thermosetting resin.

The organic EL device 1 as described above can be used as a light source and the like as well as a display apparatus and the like. Further, the organic EL device 1 can be used for various kinds of optical applications.

Furthermore, in the case of applying the organic EL device 1 to the display apparatus, a plurality of the organic EL devices 1 are provided in the display apparatus. One Example of such a display apparatus will be described below with reference to FIG. 2.

Figure 2:
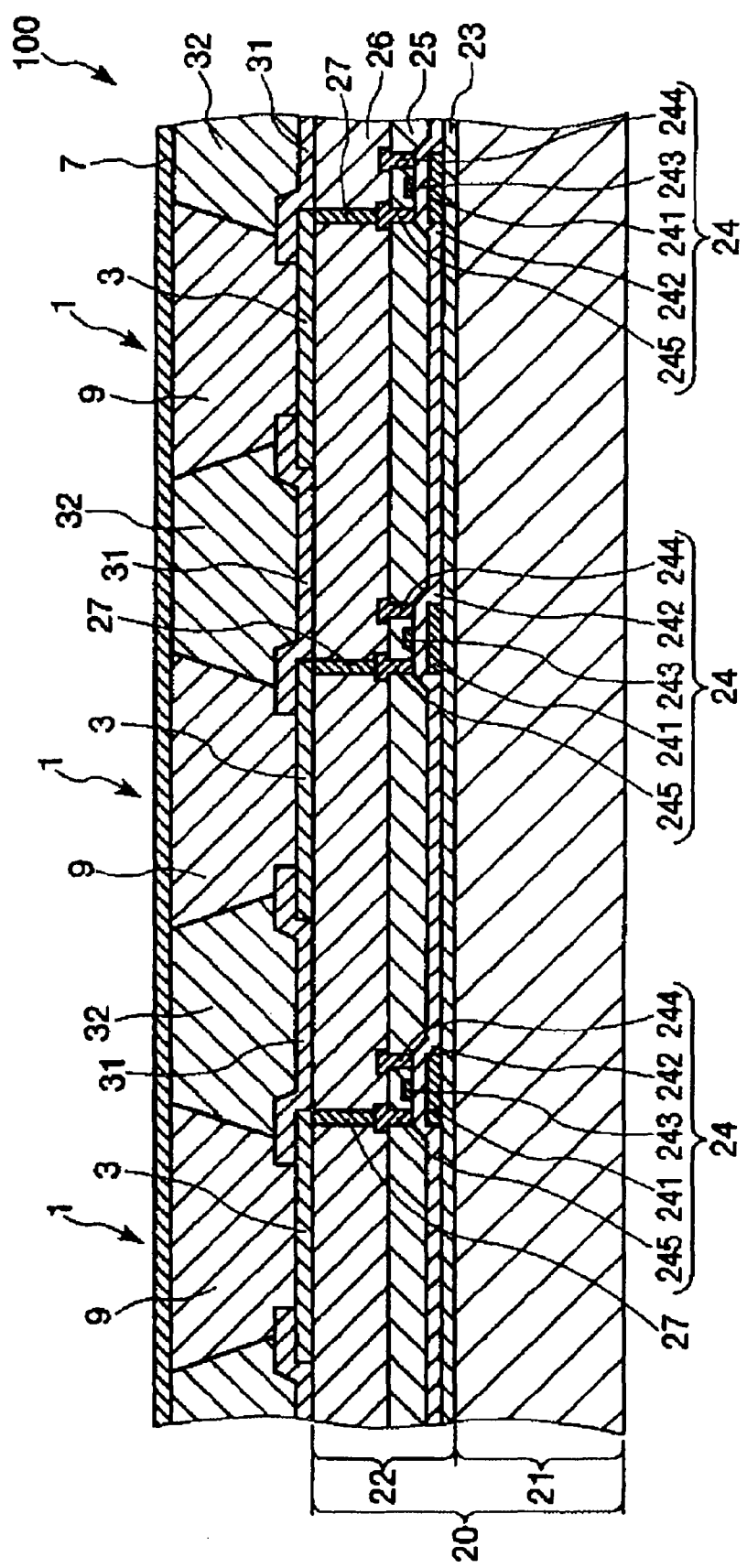
FIG. 2 is a vertical sectional view which shows an embodiment of a display apparatus provided with the organic EL device.

FIG. 2 is a vertical section view which shows a display apparatus provided with a plurality of organic EL devices.

As shown in FIG. 2, a display apparatus 100 includes a base 20 and a plurality of the organic EL devices 1 provided on the base 20.

The base 20 includes a substrate 21 and a circuit section 22 formed on the substrate 21.

The circuit section 22 includes a protective layer 23 provided on the substrate 21 and formed from a titanium oxide layer, driving TFTs (switching element) 24 formed on the protective layer 23, a first insulation layer 25, and a second insulation layer 26.

The driving TFTs 24 include semiconductor layers 241 made of a silicon, gate insulation layers 242 formed on the semiconductor layers 241, gate electrodes 243 formed on the gate insulation layers 242, source electrodes 244, and drain electrodes 245.

The organic EL devices 1 are provided on the circuit section 22 having the above structure so as to be associated with the respective driving TFTs 24. Further, the adjacent organic EL devices 1 are partitioned by the first partitioning wall portions 31 and second partitioning wall portions 32.

In this embodiment, the anode 3 of each of the organic EL devices 1 constitutes a pixel electrode, and it is electrically connected to the drain electrodes 245 of the corresponding driving TFTs 24 through the wirings 27. Further, the cathodes 7 of the organic EL devices 1 are formed from a common electrode.

Furthermore, a sealing member (not shown in the drawing) is joined to the base 20 so as to cover the respective organic EL devices 1 to thereby seal the organic EL devices 1.

The display apparatus 100 may be formed into a single color display type, but the display apparatus 100 can be configured to display a color image by selecting light emitting materials used for the respective organic EL devices 1.

Electronic Equipment

The above display apparatus 100 provided with the organic EL devices 1 (an electronic device of the present invention) can be used for various electronic equipment.

Figure 3:
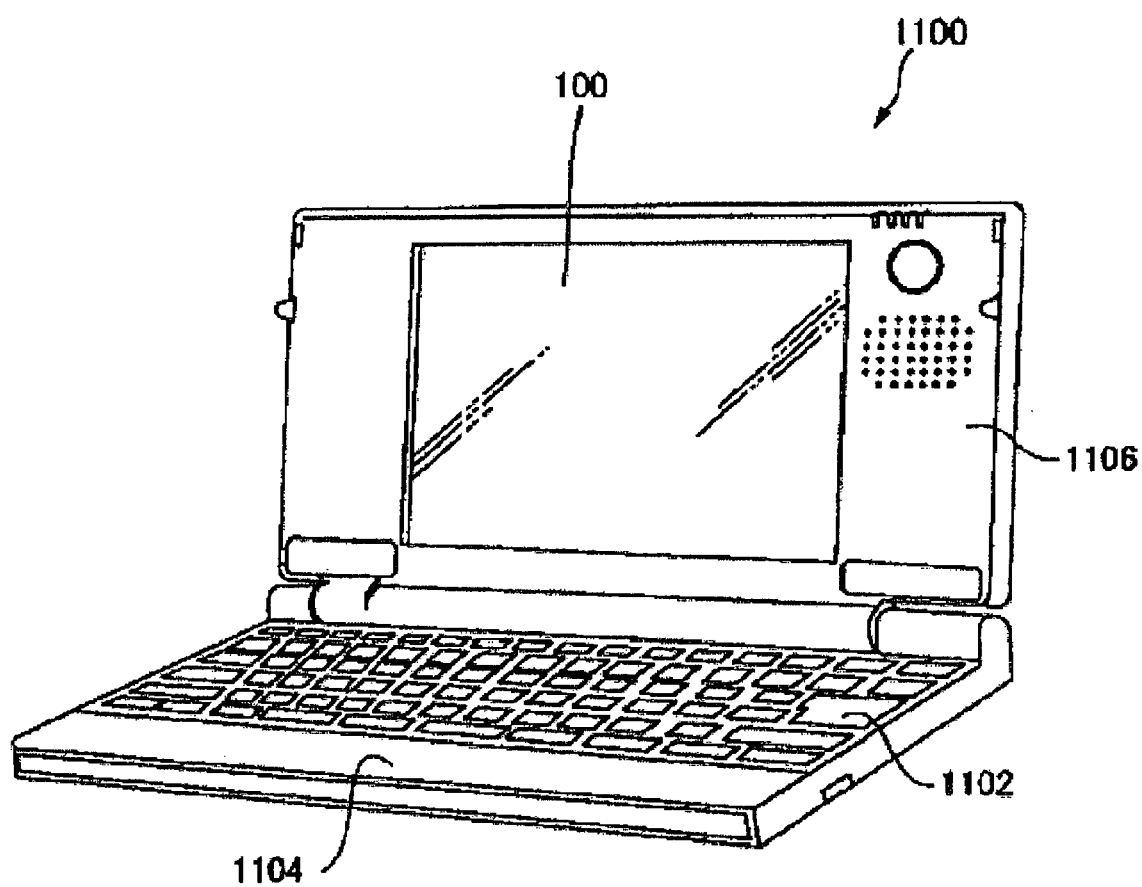
FIG. 3 is a perspective view which shows the structure of a personal mobile computer (or a personal notebook computer) which is one example of the electronic equipment according to the present invention.

FIG. 3 is a perspective view which shows the structure of a personal mobile computer (or a personal notebook computer) which is one example of the electronic equipment according to the present invention.

In FIG. 3, a personal computer 1100 is comprised of a main body 1104 provided with a keyboard 1102 and a display unit 1106 provided with a display (screen). The display unit 1106 is rotatably supported by the main body 1104 via a hinge structure.

In the personal computer 1100, the display (screen) of the display unit 1106 is constructed from the display apparatus 100 described above.

Figure 4:
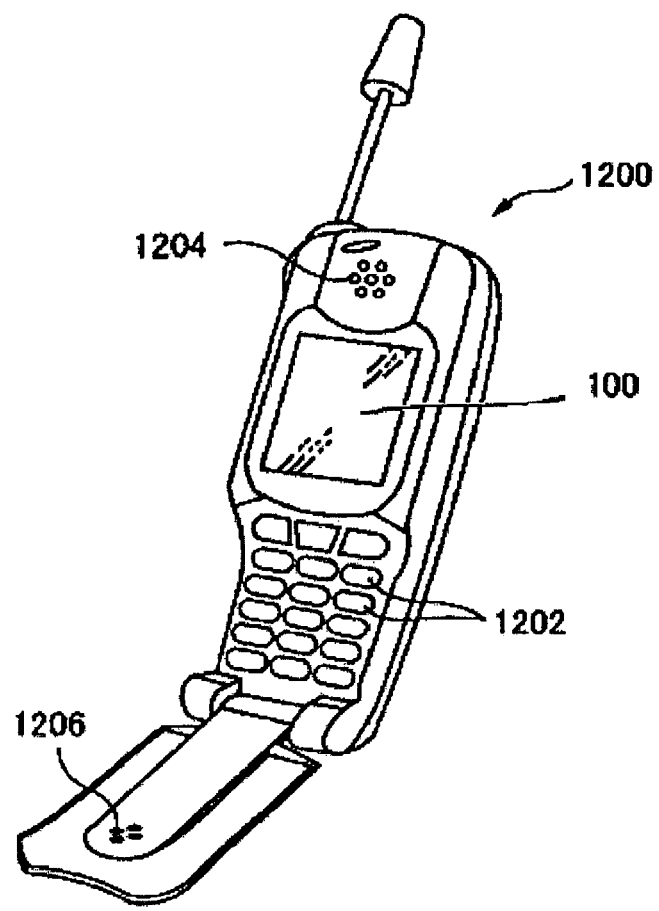
FIG. 4 is a perspective view which shows the structure of a mobile phone (including the personal handyphone system (PHS)) which is the other example of the electronic equipment according to the present invention.

FIG. 4 is a perspective view which shows the structure of a mobile phone (including the personal handyphone system (PHS)) which is the other example of the electronic equipment according to the present invention.

The mobile phone 1200 shown in FIG. 4 includes a plurality of operation buttons 1202, an earpiece 1204, a mouthpiece 1206, and a display.

In this mobile phone 1200, the display is constructed from the display apparatus 100 as described above.

Figure 5:
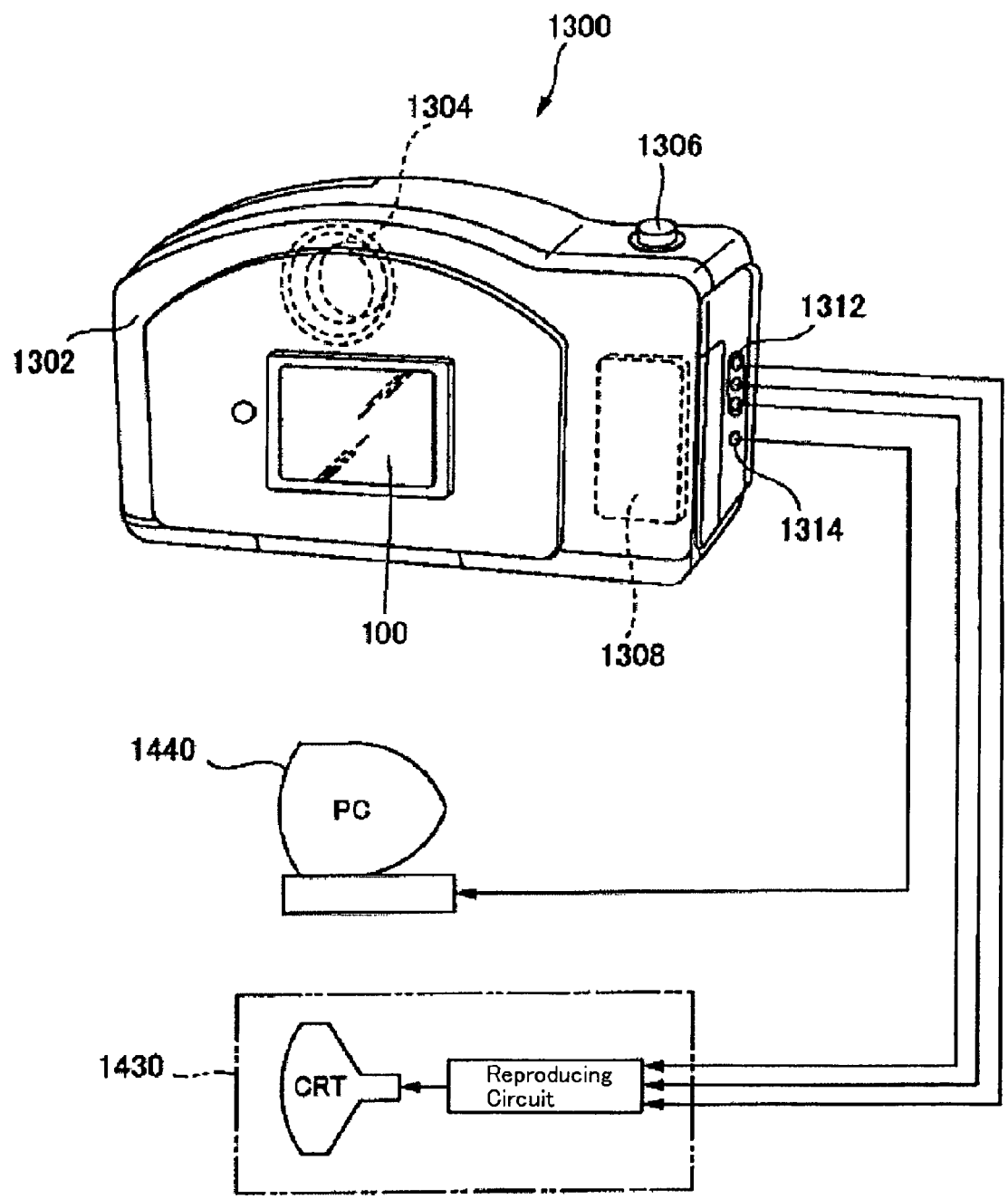
FIG. 5 is a perspective view which shows the structure of a digital still camera which is still other example of the electronic equipment according to the present invention.

FIG. 5 is a perspective view which shows the structure of a digital still camera which is still other example of the electronic equipment according to the present invention. In this drawing, interfacing to external devices is simply illustrated.

In a conventional camera, a silver salt film is exposed to the optical image of an object. On the other hand, in the digital still camera 1300, an image pickup device such as a CCD (Charge Coupled Device) generates an image pickup signal (or an image signal) by photoelectric conversion of the optical image of an object.

In the rear surface of a case (or a body) 1302 of the digital still camera 1300, there is provided a display which provides an image based on the image pickup signal generated by the CCD. That is, the display functions as a finder which displays the object as an electronic image.

In this digital still camera 1300, the display is constructed from the display apparatus 100 described above.

In the inside of the case, there is provided a circuit board 1308. The circuit board 1308 has a memory capable of storing an image pickup signal.

In the front surface of the case 1302 (in FIG. 5, the front surface of the case 1302 is on the back side), there is provided a light receiving unit 1304 including an optical lens (an image pickup optical system) and a CCD.

When a photographer presses a shutter button 1306 after checking an object image on the display, an image pickup signal generated by the CCD at that time is transferred to the memory in the circuit board 1308 and then stored therein.

Further, in the side surface of the case 1302 of the digital still camera 1300, there are provided a video signal output terminal 1312 and an input-output terminal for data communication 1314. As shown in FIG. 6, when necessary, a television monitor 1430 and a personal computer 1440 are connected to the video signal output terminal 1312 and the input-output terminal for data communication 1314, respectively. In this case, an image pickup signal stored in the memory of the circuit board 1308 is outputted to the television monitor 1430 or the personal computer 1440 by carrying out predetermined operations.

The electronic equipment according to the present invention can be applied not only to the personal computer (which is a personal mobile computer) shown in FIG. 3, the mobile phone shown in FIG. 4, and the digital still camera shown in FIG. 5 but also to a television set, a video camera, a view-finer or monitor type of video tape recorder, a laptop-type personal computer, a car navigation device, a pager, an electronic notepad (which may have communication facility), an electronic dictionary, an electronic calculator, a computerized game machine, a word processor, a workstation, a videophone, a security television monitor, an electronic binocular, a POS terminal, an apparatus provided with a touch panel (e.g., a cash dispenser located on a financial institute, a ticket vending machine), medical equipment (e.g., an electronic thermometer, a sphygmomanometer, a blood glucose meter, an electrocardiograph monitor, ultrasonic diagnostic equipment, an endoscope monitor), a fish detector, various measuring instruments, gages (e.g., gages for vehicles, aircraft, and boats and ships), a flight simulator, various monitors, and a projection display such as a projector.

The electronic device and the electronic equipment according to the present invention have been described based on the embodiments shown in the drawings, but the present invention is not limited thereto.

For example, the electronic device of the present invention can be applied to a photoelectric conversion device and the like, as well as the organic EL device described above.

EXAMPLES

Next, the present invention will be described with based on the actual examples.

1. Manufacture of Organic EL Device

Five organic EL devices were manufactured in each of the following Examples and Comparative Example. In each of the Examples and Comparative Example, each organic EL device was manufactured as follows.

Example 1

<1> First, an ITO electrode (that is, an anode) was formed on a transparent glass substrate having an average thickness of 0.5 mm by a sputtering method so as to have an average thickness of 150 nm.

<2> Next, a 2.0 wt % xylene solution of N,N'-diphenyl-N,N'-bis(3-methylphenyl)-1,1'-biphenyl-4,4'-diamine (TPD1) was applied onto the ITO electrode by a spin coating method, and was then dried under the conditions of 100° C.×10 minutes in a nitrogen atmosphere, and further dried under the conditions of 100° C.×5 hours under reduced pressure to thereby form a hole transport layer having an average thickness of 50 nm on the ITO electrode.

<3> Next, a 0.1 wt % hot ethyl alcohol solution of 1,4-bis(9-ethyl-3-carbazovinylene)-9,9-dihexyl-fluorene represented by the following formula 1 (produced by ADS, "ADS086BE") was filtered using a Teflon ("Teflon" is a registered trademark) filter having an opening size of 25 nm (produced by SKC) under high temperature to separate insoluble matters. As a result, an intermediate layer formation material was obtained.

[formula 1]

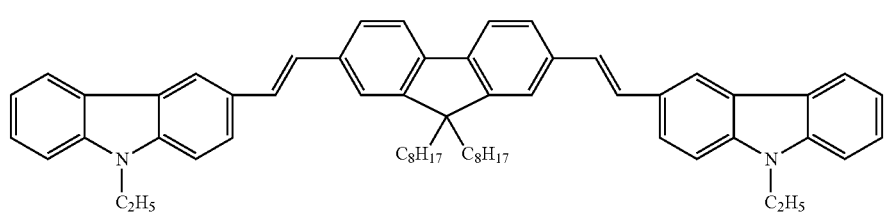

<4> Next, the intermediate layer formation material prepared in the above step <3> was applied onto the hole transport layer by a spin coating method, and was then dried under the conditions of 60° C.×30 minutes in a nitrogen atmosphere to thereby form an intermediate layer having an average thickness of 5 nm on the hole transport layer.

<5> Next, the intermediate layer was heated under the conditions of 30° C.×120 minutes under reduced pressure to stabilize it.

Thereafter, the intermediate layer formed on the light emitting layer was analyzed using a repeated reflection type polarizing infrared absorption spectrum method and a high resolution secondary ion mass spectrometry method (TOFSIMS method).

As a result of the analysis, it was confirmed that molecules of the 1,4-bis(9-ethyl-3-carbazovinylene)-9,9-dihexyl-fluorene were oriented in a state that each carbazole ring was positioned on the side of the intermediate layer adjacent to the hole transport layer and each fluorine ring was positioned on the opposite side of the intermediate layer.

<6> Next, poly(9,9-dioctyl-2,7-divinylenefluorenyl-ortho-co(anthracene-9,10-diyl) (weight average molecular weight: 200,000) was applied onto the intermediate layer by a vacuum evaporation using a vacuum evaporation apparatus, and was then dried under the conditions of 50° C.×10 minutes in a state that the inside of the vacuum evaporation apparatus was decompressed, and further dried under the conditions of 100° C.×60 minutes in a nitrogen atmosphere outside the vacuum evaporation apparatus to thereby form a light emitting layer having an average thickness of 50 nm on the intermediate layer.

In this regard, it is to be noted that the vacuum evaporation was carried out by placing the poly(9,9-dioctyl-2,7-divinylenefluorenyl-ortho-co(anthracene-9,10-diyl) into a boat provided in the vacuum evaporation apparatus, and then decompressing the inside of the vacuum evaporation apparatus at a pressure of $1 \times 10^{-3}$ Pa or lower in a state that the boat was heated.

<7> Next, Ca and Al were applied onto the light emitting layer by a continuous vacuum evaporation to thereby form a laminated electrode (that is, a cathode) on the light emitting layer. In this regard, it is to be noted that the laminated electrode was comprised of a layer constituted of Ca and having an average thickness of 1 nm, and a layer constituted of Al and having an average thickness of 300 nm.

<8> Next, a protection cover made of borosilicate glass was provided so as to cover these layers described above, and was then secured and sealed with an ultraviolet curable resin to obtain an organic EL device.

Example 2

An organic EL device was obtained in the same manner as in Example 1, except that the intermediate layer formation material was prepared by changing the 1,4-bis(9-ethyl-3-carbazovinylene)-9,9-dihexyl-fluorene to a compound represented by the following formula 2 (produced by ADS, "ADS331BE") in the above step <3>.

The compound was comprised of a molecule in which N,N-bis(4-methylphenyl)-4-anylines are bonded to both ends of poly(9,9-dioctylfluorenyl-2,7-diyl), respectively. In this example 2, a low molecular type compound (that is, in the formula 2, $n^1$ was 2 to 6) was used.

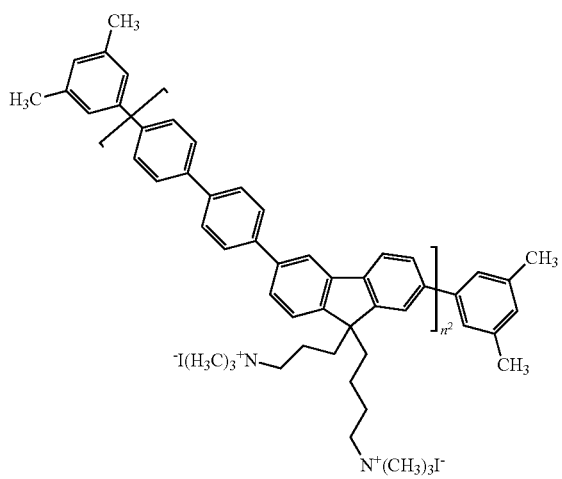

[formula 3]

Example 4

An organic EL device was obtained in the same manner as in Example 1, except that the intermediate layer formation material was prepared by changing the 1,4-bis(9-ethyl-3-carbazovinylene)-9,9-dihexyl-fluorene to 9-fluorenol in the above step <3>.

Example 5

An organic EL device was obtained in the same manner as in Example 1, except that the intermediate layer formation

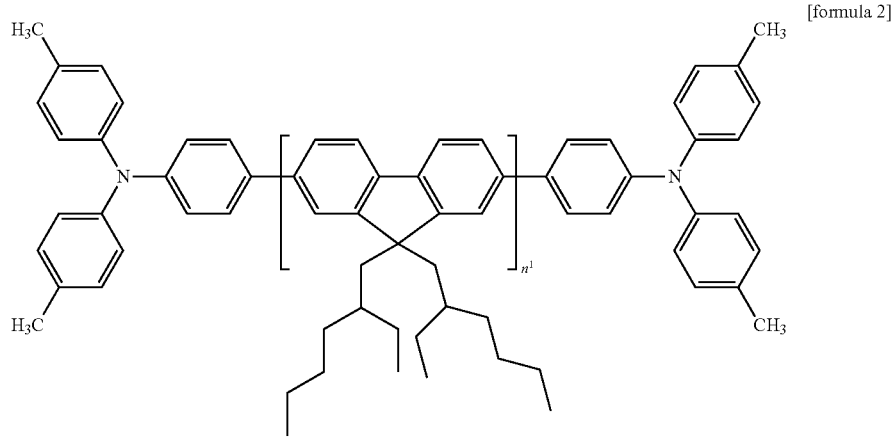

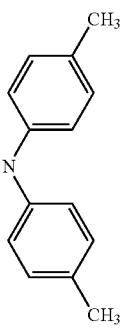

[formula 2]

Example 3

An organic EL device was obtained in the same manner as in Example 1, except that the intermediate layer formation material was prepared by changing the 1,4-bis(9-ethyl-3-carbazovinylene)-9,9-dihexyl-fluorene to poly[(9,9-di(3,3'-N,N-trimethylammonium)propylfluorenyl-2,7-diyl)-alt-(1,4-biphenylene)]-3,5-dimethylphenyl diiodido represented by the following formula 3 (produced by ADS, "ADS181BE") in the above step <3>. In this regard, it is to be noted that in the formula 3, $n^2$ was 2 to 6.

material was prepared by changing the 1,4-bis(9-ethyl-3-carbazovinylene)-9,9-dihexyl-fluorene to 9-carboxyfluorene in the above step <3>.

Comparative Example

An organic EL device was obtained in the same manner as in Example 1, except that the above steps <4> to <6> (that is, the step of forming the intermediate layer) were omitted.

2. Evaluation

The electrification current (A), the luminous brightness (cd/m$^2$), the maximum luminous efficiency (1 m/W), and the time that elapsed before the luminous brightness became half of the initial value (that is, a half-life) of each of the organic EL devices obtained in the Examples and Comparative Example mentioned above were measured.

In this regard, it is to be noted that these measurements were made by applying a voltage of 9 V between the anode and the cathode in each of the organic EL devices.

The measurement values (that is, the electrification current, the luminous brightness, the maximum luminous efficiency, and the half-life) of each of the Examples 1 to 5 were evaluated according to the following four criteria A to D, respectively, wherein the measurement values of the Comparative Example were used as reference values.

A: The measurement value was 1.50 times or more that of the Comparative Example.

B: The measurement value was 1.25 times or more but less than 1.50 times that of the Comparative Example.

C: The measurement value was 1.00 times or more but less than 1.25 times that of the Comparative Example.

D: The measurement value was 0.75 times or more but less than 1.00 times that of the Comparative Example.

TABLE 1

|  | Electrification Current | Luminous Brightness | Maximum Luminous Efficiency | Half-Life |
|---|---|---|---|---|
| Ex. 1 | A-B | A-B | A-B | A-B |
| Ex. 2 | A-B | A-B | A-B | A-B |
| Ex. 3 | A-B | A-B | B | B |
| Ex. 4 | B | B | B | B |
| Ex. 5 | B | B | B | B |
| Comp. Ex. | | | | |

Measurement values of comparative example were used as reference values.

As shown in Table 1, all the organic EL devices of each of the Examples were superior to the organic EL devices of the Comparative Example in their electrification current, luminous brightness, maximum luminous efficiency, and half-life.

From these results, it has been apparent that in each of the organic EL devices of the present invention, the adhesion at the interface between the hole transport layer and the intermediate layer and the adhesion at the intermediate layer and the light emitting layer were both improved, and therefore transfer of holes from the hole transport layer to the light emitting layer through the intermediate layer was carried out smoothly.

Further, organic EL devices were manufactured in the same manner as in Example 1 to 5, except that 2,7-bis(9,9-bis(2-methylbutyl)-9',9',9'',9''-tetrakis(n-propyl)-7,2';7'2''-terfluorene-2-yl)-9,9-bis(n-propyl)fluorene was used as the fluorene derivative for forming each light emitting layer.

And in the case where the manufactured organic EL devices were evaluated using the same evaluation method described above, the obtained results were the same as the above indicated results.

INDUSTRIAL APPLICABILITY

According to the present invention, an electronic device (organic EL device) includes an intermediate layer provided between a first organic semiconductor layer (hole transport layer) and a second organic semiconductor layer (light emitting layer) so as to make contact with both of the first organic semiconductor layer and the second organic semiconductor layer.

The intermediate layer is constituted of a compound represented by a general formula $A^1$-B-$A^2$ as a main component thereof. In the intermediate layer, molecules of this compound are oriented in a state that each group $A^1$ and each group $A^2$ are positioned on the side of the first organic semiconductor layer and each group B is positioned on the side of the second organic semiconductor layer.

Further, since each of the groups $A^1$ and $A^2$ exhibits excellent affinity for a constituent material of the first organic semiconductor layer, the intermediate layer has excellent adhesion to the first organic semiconductor layer at the contact surface therebetween.

On the other hand, since the group B exhibits excellent affinity for a constituent material of the second organic semiconductor layer, the intermediate layer has excellent adhesion to the second organic semiconductor layer at the contact surface therebetween.

As a result, since carriers can be transferred from the first organic semiconductor layer to the second organic semiconductor layer through the intermediate layer smoothly, the electronic device can exhibit high carrier transport ability. Further, electronic equipment provided with the electronic device can exhibit high reliability. Therefore, the present invention has industrial applicability.

What is claimed is:

1. An electronic device, comprising:
a pair of electrodes; and
laminated layers provided between the electrodes; wherein:
the laminated layers comprise a first organic semiconductor layer comprising a first organic semiconductor material as a main component, a second organic semiconductor layer comprising a second organic semiconductor material as a main component, a polarity of the second organic semiconductor material being lower than a polarity of the first organic semiconductor material, and an intermediate layer provided between the first and second organic semiconductor layers so as to make contact with both of the first and second organic semiconductor layers;
the intermediate layer comprises a compound represented by a general formula $A^1$-B-$A^2$, where:
each of $A^1$ and $A^2$ comprises at least one of a tertiary amino alkyl group, a trimethyl amino propyl group, and a trimethyl amino butyl group,
$A^1$ and $A^2$ are the same or different, and both $A^1$ and $A^2$ are present or one of $A^1$ and $A^2$ is present, and
B is a group comprising a fluorene ring; and
molecules of the compound are oriented in a state that each group $A^1$ and each group $A^2$ are positioned adjacent to the first organic semiconductor layer and each group B is positioned adjacent to the second organic semiconductor layer.

2. The electronic device as claimed in claim 1, wherein the group $A^1$ and the group $A^2$ are the same.

3. The electronic device as claimed in claim 1, wherein a part of the compound is penetrated into the first organic semiconductor layer.

4. The electronic device as claimed in claim 1, wherein a part of the compound is penetrated into the second organic semiconductor layer.

5. The electronic device as claimed in claim 1, wherein an average thickness of the intermediate layer is 10 nm or less.

6. The electronic device as claimed in claim 1, wherein the laminated layers are obtained by laminating the layers successively from one of the first and second organic semiconductor layers.

7. The electronic device as claimed in claim 6, wherein:
the intermediate layer is formed using a liquid phase process, and
molecules of the compound are oriented by utilizing a difference between an affinity of each of the groups $A^1$ and $A^2$ for the one of the first and second organic semiconductor layers and an affinity of the group B for the one of the first and second organic semiconductor layers.

8. The electronic device as claimed in claim 7, wherein a material used for forming the intermediate layer is capable of dissolving or swelling the one of the first and second organic semiconductor layers.

9. The electronic device as claimed in claim 6, wherein the other of the first and second organic semiconductor layers is formed using a liquid phase process.

10. The electronic device as claimed in claim 9, wherein a material used for forming the other of the first and second organic semiconductor layers is capable of dissolving or swelling the intermediate layer.

11. The electronic device as claimed in claim 1, wherein:
the electronic device is an organic electroluminescence device, and
the first organic semiconductor layer is a carrier transport layer and the second organic semiconductor layer is a light emitting layer.

12. Electronic equipment provided with the electronic device defined in claim 1.

13. An electronic device, comprising:
a pair of electrodes; and
laminated layers provided between the electrodes; wherein:
the laminated layers comprise a first organic semiconductor layer comprising a first organic semiconductor material as a main component, a second organic semiconductor layer comprising a second organic semiconductor material as a main component, a polarity of the second organic semiconductor material being lower than a polarity of the first organic semiconductor material, and an intermediate layer provided between the first organic semiconductor layer and the second organic semiconductor layer so as to make contact with both of the first organic semiconductor layer and the second organic semiconductor layer;
a combination of the first organic semiconductor material and the second organic semiconductor material is selected from the group consisting of
a combination of an arylanthracene derivative and at least one of a porphyrin metallic salt, an amide of the porphyrin metallic salt and a sulfonic acid derivative of the porphyrin metallic salt;
a combination of a fluorofluorene derivative and at least one of a phthalocyanine metallic salt, an amide of the phthalocyanine metallic salt and a sulfonic acid derivative of the phthalocyanine metallic salt;
a combination of a cyanine-based material and a polyphenylenevinylene-based material; and
a combination of a phenazine derivative and a vinylcarbazole-based material;
the intermediate layer comprises a compound represented by a general formula $A^1$-B-$A^2$, where:
each of $A^1$ and $A^2$ comprises at least one of a tertiary amino alkyl group, a trimethyl amino propyl group, and a trimethyl amino butyl group,
$A^1$ and $A^2$ are the same or different, and both $A^1$ and $A^2$ are present or one of $A^1$ and $A^2$ is present, and
B is a group comprising a fluorene ring; and
molecules of the compound are oriented in a state that each group $A^1$ and each group $A^2$ are positioned adjacent to the first organic semiconductor layer and each group B is positioned adjacent to the second organic semiconductor layer.

14. The electronic device of claim 13, wherein each of $A^1$ and $A^2$ comprises at least one of a trimethyl amino propyl group and a trimethyl amino butyl group.

15. The electronic device of claim 1, wherein a combination of the first organic semiconductor material and the second organic semiconductor material is selected from the group consisting of:
a combination of an arylamine derivative as the first organic semiconductor material, and a fluorene derivative as the second organic semiconductor material;
a combination of at least one of a porphyrin metallic salt, an amide of the porphyrin metallic salt, and a sulfonic acid derivative of the porphyrin metallic salt as the first organic semiconductor material, and an arylanthracene derivative as the second organic semiconductor material;
a combination of at least one of a phthalocyanine metallic salt, an amide of the phthalocyanine metallic salt, and a sulfonic acid derivative of the phthalocyanine metallic salt as the first organic semiconductor material, and a fluorofluorene derivative as the second organic semiconductor material;
a combination of a cyanine-based material as the first organic semiconductor material, and a polyphenylenevinylene-based material as the second organic semiconductor material; and
a combination of a phenazine derivative as the first organic semiconductor material, and a vinylcarbazole-based material as the second organic semiconductor material.

* * * * *